(12) United States Patent
Makwana et al.

(10) Patent No.: US 11,979,956 B2
(45) Date of Patent: May 7, 2024

(54) READING DATA FROM A LOG DATA STORAGE IN AN EMERGENCY LIGHTING CONVERTER

(71) Applicant: Tridonic GmbH & Co KG, Dornbirn (AT)

(72) Inventors: Deepak Makwana, Newcastle Upon Tyne (GB); Jagjitpati Shukla, Durham (GB); Stephen James, Redcar (GB)

(73) Assignee: Tridonic GmbH & Co KG, Dornbirn (AT)

( * ) Notice: Subject to any disclaimer, the term of this patent is extended or adjusted under 35 U.S.C. 154(b) by 262 days.

(21) Appl. No.: 17/624,992

(22) PCT Filed: Jul. 30, 2020

(86) PCT No.: PCT/EP2020/071614
§ 371 (c)(1),
(2) Date: Jan. 5, 2022

(87) PCT Pub. No.: WO2021/019062
PCT Pub. Date: Feb. 4, 2021

(65) Prior Publication Data
US 2022/0264724 A1    Aug. 18, 2022

(30) Foreign Application Priority Data

Jul. 30, 2019 (EP) .................................... 19188969

(51) Int. Cl.
*H05B 47/105*    (2020.01)
*F21S 9/02*    (2006.01)
(Continued)

(52) U.S. Cl.
CPC ............ *H05B 47/105* (2020.01); *F21S 9/022* (2013.01); *H05B 45/37* (2020.01); *H05B 47/16* (2020.01)

(58) Field of Classification Search
CPC ....... H05B 47/105; H05B 47/16; H05B 45/37
See application file for complete search history.

(56) References Cited

U.S. PATENT DOCUMENTS 6,502,044 B1   12/2002  Lane et al.
2011/0260752 A1  10/2011  Jouin et al.

FOREIGN PATENT DOCUMENTS

DE   102016210413   12/2017
GB      2568320      5/2019

OTHER PUBLICATIONS

Atmel, "8-bit AVR Microcontroller with 32KBytes In-System Programmable Flash ATmega32", pp. 1, 2, 3, 62, 63, Feb. 28, 2011, pp. 1, 2, 3, 62, 63; Entire publication can be found at http://ww1.microchip.com/downloads/en/devicedoc/doc2503.pdf.

(Continued)

*Primary Examiner* — Joseph L Williams
(74) *Attorney, Agent, or Firm* — Andrus Intellectual Property Law, LLP (57) ABSTRACT

An emergency converter device for lighting applications provides a supply current to a load device such as a lighting module. The emergency converter device has a printed circuit board arranged within a housing. A control circuit such as a microcontroller and a non-volatile memory for storing log data are arranged on the printed circuit board. An interface is configured to connect mechanically and electrically at least one of a status indicator light a test switch or a duration link select switch. The interface has a first connecting element and a second connecting element. The emergency converter device has a connecting means for connecting a data output terminal (USART_TX) and a data input terminal (USART_RX) of the control circuit to the exterior of the housing.

11 Claims, 5 Drawing Sheets

(51) Int. Cl.
*H05B 45/37* (2020.01)
*H05B 47/16* (2020.01)

(56) References Cited

OTHER PUBLICATIONS

PCT/EP2020/071614, International Search Report, dated Sep. 29, 2002, 4 pages.
PCT/EP2020/071614, Written Opinion of the International Searching Authority, dated Sep. 29, 2002, 8 pages.

READING DATA FROM A LOG DATA STORAGE IN AN EMERGENCY LIGHTING CONVERTER

CROSS REFERENCE TO RELATED APPLICATION

The present application is the U.S. national stage application of international application PCT/EP2020/071614 filed Jul. 30, 2020, which international application was published on Feb. 4, 2021 as International Publication WO 2021/019062 A1. The international application claims priority to European Patent Application 19188969.0 filed Jul. 30, 2019.

FIELD OF THE INVENTION

The invention is in the field of emergency light converter devices for lighting applications, which have interfaces to a test switch, a status indicator light and duration selection switches. The invention proposes an approach for at least accessing an internal log data storage of the emergency converter device.

BACKGROUND OF THE INVENTION

An emergency converter device (emergency lighting converter, ballast, driver device) provides a supply voltage to an emergency light for a predetermined time in case mains supply fails. The voltage supply is maintained in case of a mains supply failure for a rated service time using energy stored in an energy storage device such as a rechargeable battery. The rated service time defines a battery discharge duration during which time the emergency converter is required to drive the emergency light with a predetermined load current.

The functionality of an emergency light system, and the emergency lighting converter as key element of the emergency lighting system, has to be tested at predefined intervals by performing functional tests and has to be continuously monitored during operation using built-in test equipment.

A functional test is initiated for example by operating a test switch arranged at or externally to the emergency lighting converter of the emergency light system. The test switch may connect to the emergency lighting converter via a two-wire interface. The test switch interface connects the test switch to a microcontroller controlling operations of the emergency lighting device.

A current operational state of the emergency converter is signalled using a status indicator light (indicator light emitting diode) mounted such that it is visible from external to an emergency luminaire housing the emergency lighting converter. Sometimes, a bicolour status indicator light, for example comprising a red light emitting diode (LED) and a green LED is used to indicate plural different operational statuses of the emergency converter. Accordingly, at least two terminals of an indicator light interface for driving the status indicator light based on a drive signal from the microcontroller of the emergency lighting converter are necessary.

Even if the test switch and the status indicator light would be mounted integrally with the emergency converter, the test switch interface and the status indicator light interface respectively use four terminals of the microcontroller and in case of a modular assembly of the emergency converter, the test switch and the status indicator light use at least four electrical connecting terminals at an interface externally accessible with respect to a housing assembly of the emergency lighting converter.

Emergency lighting converters, in particular when designed for more advanced product ranges, may include a possibility for selecting the exact rated service time in case of a mains supply failure using the energy stored in the rechargeable battery. For example, by operating jumper switches or DIP switches, a user may select the rated service time as the minimum time for illuminating an emergency light to be either 1 or 3 hours. This duration selection interface requires further parallel signal lines, whose number depends on the number of selectable options.

Each of these interfaces have to be externally accessible in order to connect the respectively externally arranged duration select link, test switch device, indicator LED. Moreover, terminals for connecting the emergency lighting module, an externally arranged energy storage device are also arranged externally accessible at the housing of the emergency lighting converter.

The microcontroller circuit of the emergency lighting converter includes a non-volatile memory, which stores log data generated during operation of the emergency lighting converter. This log data file may be read out from the log data memory via a suitable communication interface using a log data reader (black box reader, black box repeater) and stored externally or immediately analysed.

A suitable communication interface for reading the log data file may be read out from the log data memory is, however, not common in a compact emergency lighting converter designed to be available at competitive cost or for mounting in confined spaces. In order to access the log data memory via the microcontroller of this basic emergency lighting converter, first, the housing assembly is opened, ground terminal and power supply terminal of the microcontroller are connected are connected with ground and power supply voltage VCC respectively. Data receive terminal and data transmit terminals of the microcontroller are used to read the log data from the log data memory using the log data reader. This lengthy procedure involves manually opening the housing assembly of the emergency lighting converter and is accordingly disadvantageous.

SUMMARY OF THE INVENTION

The invention addresses the problem of improving the process of reading log data stored in the emergency lighting converter.

The emergency converter according to claim 1 provides an advantageous solution according to a first aspect to the problem. The system according to a second aspect and the method according to the third aspect address the problem.

The dependent claims define further advantageous embodiments of the invention.

In a first aspect, an emergency lighting converter device for providing a supply current to a lighting device comprises at least one printed circuit board arranged within a housing, a control circuit and a non-volatile memory for storing data arranged on the at least one printed circuit board, and an interface. The interface is configured to connect mechanically and electrically at least one of an status indicator light, a test switch or a duration link selector using at least a first connecting element and a second connecting element of the interface. The emergency converter device is characterized in that the emergency converter device comprises connecting means for connecting a data output terminal and a data input terminal of the control circuit to the exterior of the housing. The connecting means is configured to connect the first connecting element with the data output terminal and to connect the second connecting element with the data input terminal of the control circuit.

The inventive emergency lighting converter device uses connecting elements intended for a first function, such as connecting a test switch, connecting the status indicator light or the duration select switch for the second, independent function of reading data from the log data memory in the emergency lighting converter device and transmitting data to the control circuit. Consequently, no additional connector providing a two-line data transmission dedicated to data transfer only has to be envisaged at the housing assembly of the emergency lighting converter. The emergency lighting converter may accordingly be equally compact in design as the present version, although its functionality is extended by the second function attributed to the first and second connecting elements. This second function of the first and second connecting elements is to provide a two-line communication capability from the respective data receive and data transmit terminals of the control circuit to the exterior of the emergency lighting converter device.

Opening a housing assembly of the emergency lighting converter for reading data from the non-volatile memory is no longer necessary, as the respective data transmit terminal and data receive terminal of the control circuit are now directly electrically accessible from the exterior of the housing.

The inventive solution is highly effective in terms of product development cost, manufacturing cost and logistics. The only additional structural element compared to the current emergency lighting converter device is the connecting means, which is established as a conductor on the circuit board. The connecting means comprises, in one embodiment, only two additional conductive paths on the printed circuit board of the emergency converter and further passive circuit elements with small dimensions such as resistors. Neither an additional electric connector has to be arranged at the housing, nor has any amendment of the design of the housing assembly to be performed for implementing the inventive emergency converter device. This means that the inventive emergency lighting converter device provides a replacement for the current emergency lighting converter device with same mechanical exterior characteristics, a same design but a significantly increased functionality by providing an externally accessible non-volatile memory for storing log data files.

In a preferred embodiment, the interface comprises a status indicator light interface configured to connect the status indicator light and a test switch interface configured to connect the test switch.

The emergency converter device may include the interface adapted to connect a first terminal of the status indicator light interface as a third connecting element, a second terminal of the status indicator light interface as the first connecting element, a first terminal of the test switch terminal as the second connecting element and a second terminal of the test switch interface as a fourth connecting element.

Preferably, the third connecting element is connected with a voltage supply contact of the control circuit, and the fourth connecting element is connected with a ground contact of the control circuit.

Thus, using the third and fourth connecting elements to externally provide power supply and earth potential (ground) to the control circuit, reading of the log data from the emergency lighting converter device is entirely controlled and performed via first to fourth connecting elements from the exterior of the emergency lighting converter device, thereby using an existing interface of the emergency converter device for a different, added function and simultaneously dispensing with the need for additional dedicated connectors or opening the housing assembly in order to implement the function.

Advantageously, the interface comprises the first, second, third and fourth connecting elements arranged in a single connector.

If the emergency lighting converter device uses the connector construed as a single device including the first, second, third and fourth connecting elements, an electric adapter device for contacting the single connector is designed as the matching counterpart to the single connector. Connecting and disconnecting the adapter device for reading the log data only requires connecting and disconnecting one connector for establishing the electric connection between the log data reader device and the emergency lighting converter device. The mechanical characteristics, for example, rigidity of the link using a single connector, are also most advantageous.

The emergency converter device according to an alternative embodiment has the interface comprising a duration link select interface configured to connect the duration link select switch and a test switch interface configured to connect the test switch.

The duration link select switch of the emergency lighting converter may be realized via a duration link select interface including adjacent connector pins arranged in a line and a jumper, which can be plugged onto the pins in alternative positions. Depending on the actual jumper position, pins are either connected to ground potential or open. The jumper is to be plugged and unplugged in an easy manner. Thus unplugging the jumper and connecting an adapter device for connecting the log data reader is an unproblematic process. Therefore, using the duration link select interface for the inventive approach is an advantageous embodiment. The duration link select interface also includes a connecting element connected with device ground potential. It is therefore well suited for providing a ground connection to the emergency lighting converter device from the log data reader device during the log data reading process.

The interface can be configured to connect a first terminal of the duration link select interface as the first connecting element, the second terminal of the duration link select interface as a fourth connecting element to a ground contact of the control circuit, a third terminal of the duration link select switch as the second connecting element and a first terminal of the test switch interface as a third connecting element to a voltage supply contact of the control circuit.

The duration link select interface usually includes two connecting elements, which are alternately linked with ground potential depending on an actual jumper position. Therefore, first to third connecting elements of the interface for realizing the log data reading function may be advantageously implemented using the terminals of the duration link select interface, as the amendments in the circuit design of the printed circuit board of the emergency lighting converter device will be only modest.

The interface can comprises the status indicator light interface, the duration link select interface and the test switch interface each designed and provided as mechanically separate connectors mounted on the at least one printed circuit board.

The inventive approach for reading log data from the internal non-volatile memory, which may be included in the control circuit or be connected to it, is not restricted to contacting elements of a single connector, but may also use connecting elements of mechanically distinct connectors, for example, selecting connecting elements such that interventions and amendments in an existing printed circuit board design are minimized. Moreover, implementing the additional function of reading out log data without opening the housing assembly does not require a single connector, but may be distributed among the existing connectors together forming the electric interface of the emergency lighting converter device to the exterior.

The emergency converter device may provide a load current for driving the lighting device, which can include at least one light emitting diode.

According to a second aspect, a system addressing the problem comprises an emergency converter device according to one of the discussed embodiments, a data reader/repeater device and an adapter device. The adapter device is configured to connect the emergency converter device and the data reader/repeater device electrically. The adapter device is configured to connect to the first connecting element and the second connecting element of the interface of the emergency converter device, and to provide electric power to a third connecting element of the interface and to connect a fourth connecting element of the interface with protective ground potential.

According to a third aspect, a method for reading data from an internal non-volatile memory of the emergency converter device addresses the problem. The emergency converter device comprises at least one printed circuit board arranged within a housing, a control circuit and a non-volatile memory for storing data are arranged on the at least one printed circuit board, and an interface. The interface connects mechanically and electrically at least one of a status indicator light, a test switch and a duration link select switch via at least a first connecting element and a second connecting element of the interface. The emergency converter device comprises connecting means for connecting a data output terminal and a data input terminal of the control circuit to the exterior of the housing, wherein the connecting means is configured to connect the first connecting element with the data output terminal and to connect the second connecting element with the data input terminal (USART_RX) of the control circuit. The method comprises steps of connecting an adapter device to the first connecting element and the second connecting element of the interface of the emergency converter device, a third connecting element of the interface to a power supply line of the adapter device and to connect a fourth connecting element of the interface to a ground contact element of the adapter device. In a subsequent step, the data reader device provides electric power to the third connecting element of the interface via the adapter device. Then, data is read from the non-volatile memory via the first and second connecting elements of the interface using the data reader device connected to the first and second connecting elements via the adapter device.

BRIEF DESCRIPTION OF THE DRAWINGS

The figures provide a discussion of embodiments of the invention in more detail.

DETAILED DESCRIPTION

In the figures, same reference numbers denote same or equivalent structures. The explanation of structures with same reference numbers in different figures is avoided where deemed possible for sake of conciseness. In order to avoid any confusion because of an overload of reference numerals in the drawings, not every reference numeral is repeated in every one of the drawings.

Figure 1:
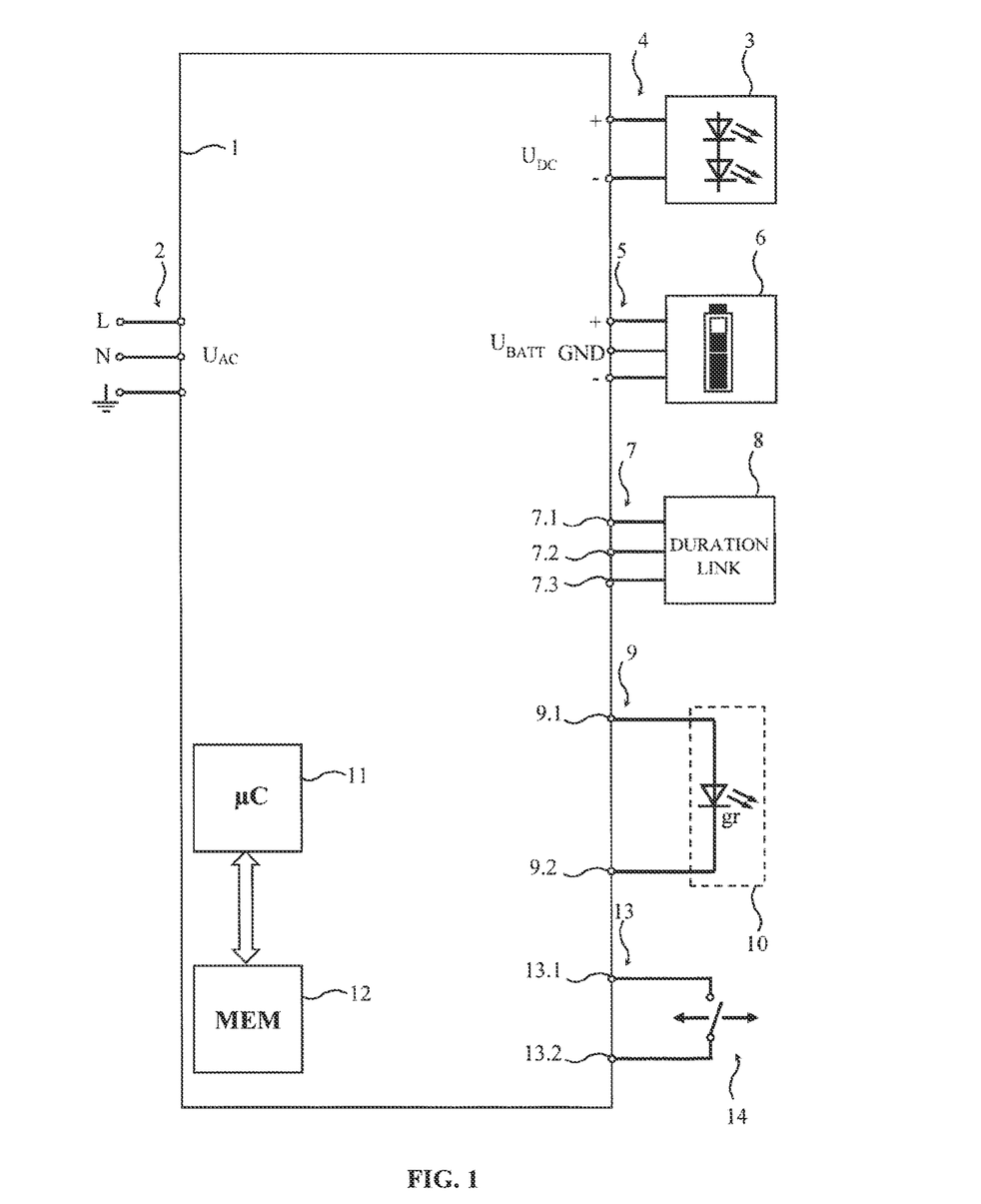
FIG. 1 depicts an overview over the external interfaces of an emergency lighting converter device, FIG. 2 an emergency lighting converter device according to a first embodiment, FIG. 3 an emergency lighting converter device according to a second embodiment, FIG. 4 provides a schematic overview of the mechanical layout of the interface of an emergency lighting converter, FIG. 5 provides a schematic overview of the mechanical layout of the interface of an emergency lighting converter device according to the first embodiment, FIG. 6 provides a schematic overview of the mechanical layout of the interface of an emergency lighting converter device according to the second embodiment, and FIG. 7 a simplified flowchart with method steps for a data reading method according to an embodiment.

FIG. 1 provides a general overview of an emergency lighting converter device 1 with typical interfaces to externally arranged devices and accessories such as a test switch or a status indicator light. FIG. 1 concentrates on those elements and interfaces of the emergency lighting converter device 1, which support an understanding of the invention.

Via a power supply interface 2, a mains supply, for example an alternating voltage $V_{AC}$ of 230 V/50 Hz, from a mains infrastructure of a building is provided to the emergency lighting converter device 1.

The emergency lighting converter device 1 is adapted to provide a load voltage $U_{DC}$ to one or more lighting devices 3 (lighting modules) via a lighting interface 4. There may be further lighting interfaces 4 for connecting plural lighting devices 3 in parallel.

The lighting device 3 typically includes light emitting devices such as light emitting diodes (LED) or gas discharge lamps, which are supplied with the load voltage $U_{DC}$ or the load current $I_{LED}$ via the lighting interface 4. The lighting device 3 may include one or more light emitting devices exclusively dedicated for operating during an emergency operation mode.

While the previously described elements are characteristic for any converter or ballast for lighting applications, too, the emergency lighting converter device 1 also comprises a battery interface 5 for connecting a (rechargeable) battery 6 as an energy storage device storing electric energy. The rechargeable battery 6 is charged with a charge current $I_{CHARGE}$ via the battery interface 5 during a standard operation mode of the emergency lighting converter device 1. The emergency lighting converter device 1 operates in the standard operation mode from electric energy drawn from mains supply via the mains supply interface 2.

In the emergency operation mode, for example, in case of a mains supply failure, the emergency lighting converter device 1 provides the lighting device 3 with electric energy drawn from the rechargeable battery 6. In particular, the emergency lighting converter device 1 provides during the emergency operation mode the load current $I_{LED}$ with a predefined current value for a predefined minimum time, the battery discharge duration time or rated service time, to the lighting device 3.

The battery discharge duration time may for example be selectable and may be adjusted, for example, to be either 1 h or 3 h as explained above.

A duration link select interface 7 of the emergency converter 1 enables a user to preselect the battery discharge duration time. The duration link select interface 7 may comprise two or more parallel signal lines for connecting one or more select switches (battery duration select switches) 8.

The duration link select interface 7 and the select switches 8 may be implemented by a duration link selector including three pins arranged in series, the central pin being a ground pin connected with electric ground potential (device ground). A jumper, including for example a simple short circuit, may be positioned in either of two different locations on the three pins, in each of the positions providing a short circuit of one of the remaining two pins to the central ground pin.

For example, the duration link select switch 8 may be arranged on a main printed circuit board of the emergency lighting converter device 1 and its pins be accessible via an opening through a housing assembly (enclosure) of the emergency lighting converter device 1.

The duration link select interface 7 connects via signal lines to the control circuit 11 of the emergency lighting converter device 1. The control circuit 11 may contain one or more microcontroller circuits or application specific integrated circuits (ASICs). The control circuit 11 controls the emergency lighting converter device 1. The control circuit 11 can execute and control functions, for example, the change of operational modes such as the standard mode of operation, the emergency operation mode, a charging operation mode for charging the battery 6, or monitoring of a load at the lighting interface 3. The control circuit 11 may perform test functions for the emergency lighting converter device 1 and its various interfaces and also control a battery charging circuit, not shown in FIG. 1.

The control circuit 11 may perform as a data logger or data recorder by recording data over time or in relation to a location of the emergency lighting converter device 1, for example, from a built in instrument or sensor or on operational statuses, failures, etc. The control circuit 11 stores the data in a non-volatile memory 12, either internally arranged in the control circuit 11 or arranged externally to the control circuit 11, for example, arranged on the same or another printed circuit board of the emergency lighting converter device 1.

One of the primary benefits of using data loggers is the ability to automatically collect data on a 24-hour basis. Upon activation, data loggers are typically deployed and left unattended to measure and record information for the duration of the monitoring period. This allows for a comprehensive, accurate picture of the environmental conditions and operational statuses of the emergency lighting converter device 1 being monitored.

The non-volatile memory 12 (memory 12) stores log data in one or more log data files.

One or more different test functions controlled by the control circuit 11 can be initiated by operating an externally arranged test switch 14. Additionally or alternatively, service intervals may be selected by operating the test switch 14.

The test switch 14 can be implemented in different forms, for example as a rocker switch, a toggle switch or preferably as a push button. The test switch 14 may be arranged in a casing of a luminaire to be externally accessible and operable by a person, wherein the emergency lighting converter device 1 is positioned within the casing assembly of the luminaire. The test switch 14 may be wired to the test switch interface 13 using two connecting wires. Typically, one of the terminals (connecting elements), for example the first terminal 13.1 of the test switch interface 13 is connected internally with a low voltage power supply of the emergency lighting converter device 1. The test switch 14 is configured to short-circuit the first terminal 13.1 and the second terminal 13.2 when the test switch 11 is actuated.

A status indicator light 10, depicted as a first status indicator LED is connected via the status indicator light interface 9. The status indicator light 10 connects via an interface of the emergency lighting converter device 1 with a first terminal 9.1 and a second terminal 9.3 to the emergency lighting converter device 1.

The first terminal 9.1 is connected to a first terminal (Cathode) of the first status indicator light 10 and a second terminal 10.2 (Anode) of the status indicator light 10.

The status indicator light 10 is controlled to emit light in a targeted manner. Thus, an operational state of the emergency lighting converter device 1 may be visually signalled using the status indicator light 10.

The control circuit 11 may control the status indicator light 10 in different light emitting modes such as "light on", "light off", "slow flashing", "rapid flashing" for signalling the different operation modes, operational states or results of test procedures of the emergency lighting converter device 1. Some of the different operation modes, operational states or results of test procedures may signal information such as "system ok", "functional test is ongoing", "battery backed endurance test is running", "load failure", "battery failure", "battery charging failure", or "in emergency operation mode".

Preferably, the status indicator light 10 is integrated into on a single structural module as status indicator light 10 as indicated in FIG. 1. A single structural module comprising the status indicator light 10 and even the test switch 14 may be arranged at a suitable position of an emergency luminaire including the emergency lighting converter device 1. Thus, control elements such as a test switch 14 of the emergency lighting converter device 1 as well as the status indicator light 10 are easy to operate and the status indicator light 10 is equally easy to read for a user.

Figure 2:
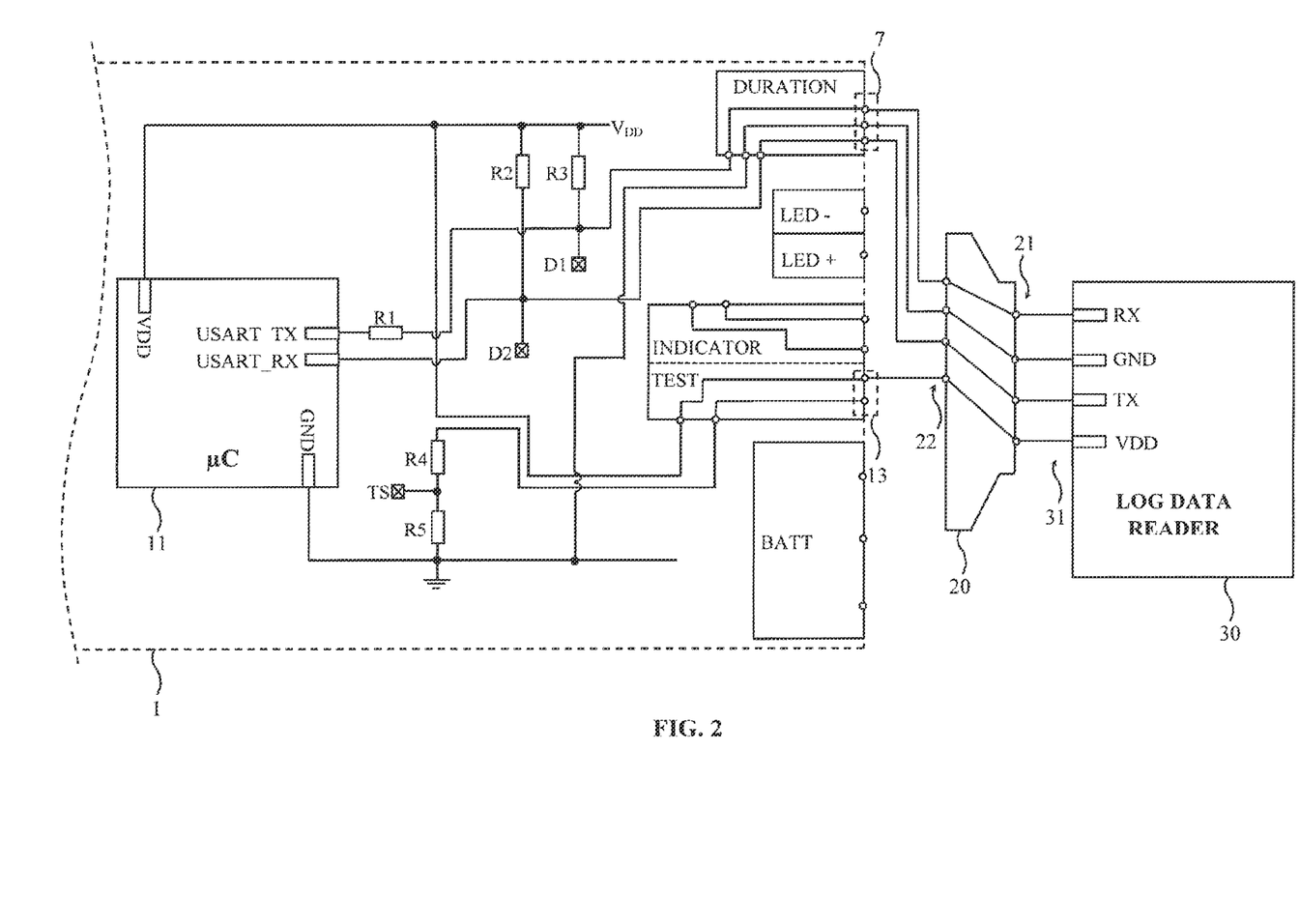

FIG. 2 depicts an emergency lighting converter device 1 according to a first embodiment together with an adapter device 20 and a log data reader device 30. The log data reader device 30, in particular its first interface 31 is connected, for example using electric cables, to a first interface 21 of the adapter device 20. The adapter device 20 can be a passive electric unit, which internally routs the electric terminals of the first interface 21 to corresponding terminals of a second interface 22.

The second interface 22 of the adapter device 20 is configured to connect to connecting elements of the interface of the emergency lighting converter device 1. The second interface 22 preferably connects each terminal of the second interface 22 to the respective terminal representing a first connecting element, second connecting, third connecting element and fourth connecting element of the interface (external interface) of the emergency lighting converter device 1.

Not specifically shown in FIG. 1, the second interface 22 may include specific connectors for connecting those connecting means (connectors) of the interface of the emergency lighting converter device 1 mechanically and electrically, which are actually used for reading out the log data and for providing electric power supply, for the reading out process of the log data to the emergency lighting converter device 1.

The adapter device 20 may be connected to the emergency lighting converter device 1 using suitable electric cables.

In order to connect the emergency lighting converter device 1 with the adapter device 20, the corresponding external devices usually connected to the emergency lighting converter device 1 via the first, second third and fourth connecting elements of the interface of the emergency lighting converter device 1 are to be disconnected. In the first embodiment, the duration link select interface 7 and the test switch interface 13 of the interface of the emergency converter device 1 are used for reading the log data from the memory 12 or writing data. Thus, the duration link select switch 8, for example, a jumper type plug, and the test switch 14 are disconnected from the duration link select interface 7 and the test switch interface 13 respectively.

In the first embodiment shown in FIG. 1, the interface of the emergency converter device 1 includes a first electric contact (terminal) 7.1 of the duration link select interface 7 as the first connecting element, the second terminal 7.2 of the duration link select interface 7 as a third connecting element, and a third terminal 7.3 of the duration link select interface 7 as the second connecting element.

Via the first connecting element, corresponding to the first terminal 7.1 of the duration link select interface 7 in FIG. 1, a data transmit terminal USART_TX of the control circuit 11 is to be accessed from the exterior of the emergency lighting converter device 1.

Via the second connecting element, corresponding to the second terminal 7.2 of the duration link select interface 7, a device ground terminal GND of the control circuit 11 is to be accessed from the exterior of the emergency lighting converter device 1.

Via the third connecting element, corresponding to the third terminal 7.3 of the duration link select interface 7, a data receive terminal USART_RX of the control circuit 11 is to be accessed from the exterior of the emergency lighting converter device 1.

A first test switch terminal 13.1 of the test switch interface 13 is used as the fourth connecting element. Via the fourth connecting element, corresponding to the first terminal 13.1 of the test switch interface 7, a voltage supply terminal VDD of the control circuit 11 is to be accessed from the exterior of the emergency lighting converter device 1.

The emergency lighting converter device 1 is depicted in FIG. 2 only with those elements as considered helpful for understanding the invention. This in particular applies to electric circuit elements and conductor paths (conductor tracks) arranged on at least one printed circuit board of the emergency converter device 1.

A connecting means according to the first embodiment comprises a conductor path connecting the data transmit terminal USART_TX of the control circuit 11 with the first connecting element of the duration link select interface 7 via the resistor R1. The connecting means according to the first embodiment further comprises a further conductor path connecting the data receive terminal USART_RX of the control circuit 11 with the second connecting element of the duration link select interface 7.

The first and second connecting elements of the first embodiment enable a bidirectional data communication with the control circuit 11 from the exterior of the emergency converter device 1.

Thus, in the first embodiment, the first and second connecting elements are implemented via the first and third terminals of the duration link select interface 7. The data receive terminal RX of the log data reader 30 is connected via the adapter device 20 to the first connecting element. The data transmit terminal TX of the log data reader device (also: data repeater or log data reader) 30 is connected via the adapter device 20 to the second connecting element. The log data reader 20 reads data from the control circuit 11, in particular from the non-volatile memory 12, using a data communication performed using the connecting means and the first and second connecting elements.

The process of reading data from the memory 12 is even possible without providing power supply to the control circuit 11 from the power supply interface 2 or the battery interface 7. The log data reader device 20 provides electric power from a power output terminal VDD via the adapter device 20 to the third connecting element. The third connecting element in the first embodiment is the first terminal 13.1 of the test switch interface 13. The first terminal 13.1 of the test switch interface 1 is in the first embodiment connected with a conductor path VDD on the printed circuit board, which provides electric power to control circuit 11. Thus, the first embodiment uses an existing conductor path on the printed circuit board to provide the necessary electric power to the power input terminal VDD of the control circuit 11 from the power output terminal VDD of the log data reader 30.

The process of reading data from the memory 12 is even possible without connecting ground to the control circuit 11, for example, from the power supply interface 2 or the battery interface 7. The log data reader device 20 provides ground potential from a ground terminal GND via the adapter device 20 to the fourth connecting element. The fourth connecting element in the first embodiment is the second terminal 7.2 of the duration link select interface 7. The second terminal 7.2 of the duration link select interface 7 is in the first embodiment connected with a device ground conductor path on the printed circuit board, which also provides device ground to the control circuit 11, in particular its ground terminal GND. Thus, the first embodiment uses an existing conductor path on the printed circuit board to connect the ground terminal GND of the control circuit 11 with the ground terminal GND of the log data reader device 30.

In alternative embodiments, the connecting means of the inventive emergency converter device 1 may include additional conducting paths that enable to provide the supply voltage $V_{DD}$ and device ground potential from the log data reader 20 to the control circuit 11.

Figure 3:
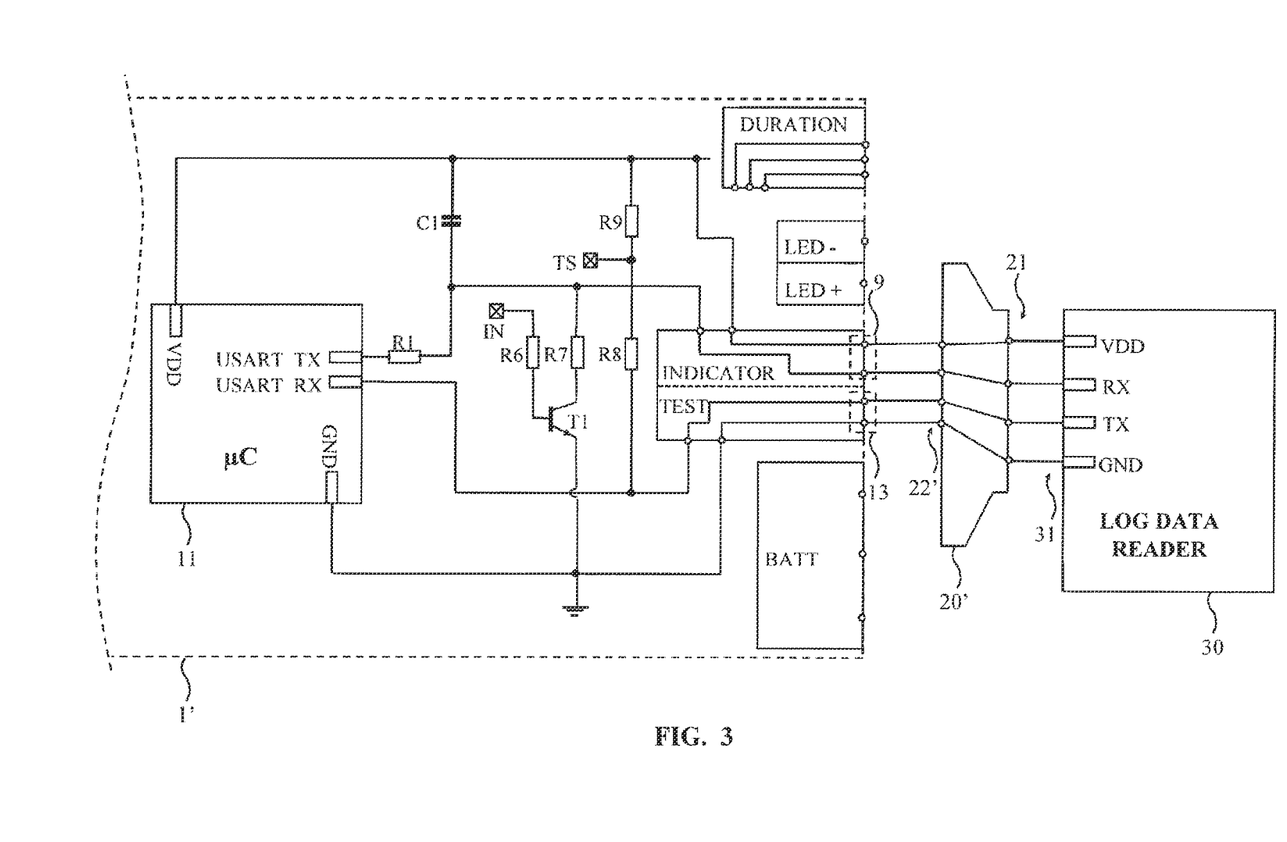

FIG. 3 depicts an emergency lighting converter device 1' according to a second embodiment connected with an adapter device 30' and the log data reader 20.

The second embodiment differs from the first embodiment in that the status indicator light interface 9 and the test switch interface 13 provide the terminals for accessing the internally arranged memory 12 within the emergency converter device 1' from the exterior and reading the log data file from the memory 12.

The log data reader 30 in FIG. 3 corresponds to the log data reader in FIG. 2. The log data reader 30 accesses the interface of the emergency converter device 1' using the adapter device 20'. The adapter device 20' includes a first interface 21 to the log data reader 30, which corresponds to the first interface 21 of the adapter device 20. The adapter device 20' comprises a second interface 22', is specifically adapted to connect to the status indicator light interface 9 and the test switch interface 13 of the emergency light converter 1'.

In the second embodiment, the test switch 14 and the status indicator light 10 are disconnected and removed from the emergency converter device 1', in order to conduct the process of reading data from the memory 12.

The first terminal 9.1 of the status indicator light interface 9 performs as the fourth connecting element in the reading process for reading log data from the memory 12. The second terminal 9.2 of the status indicator light interface 9 establishes the first connecting element when reading the log data. The first terminal 13.1 of the test switch interface 13 establishes the second connecting element when reading the log data. The second terminal 13.2 of the test switch interface 13 establishes the fourth connecting element when reading the log data.

Via the first connecting element, corresponding to the second terminal 9.2 of the status indicator light interface 9 in FIG. 1, a data transmit terminal USART_TX of the control circuit 11 is connected to the exterior of the emergency converter device 1', in particular via the adapter device 20' to the RX terminal of the log data reader device 30.

Via the second connecting element, corresponding to the first terminal 13.1 of test switch interface 13, a data receive terminal USART_RX of the control circuit 11 is connected to the exterior of the emergency converter device 1', in particular via the adapter device 20' to the TX terminal of the log data reader device 30.

Via the third connecting element, corresponding to the first terminal 9.1 of the status indicator light interface 9, the power supply terminal VDD of the control circuit 11 is connected to the exterior of the emergency converter device 1', in particular via the adapter device 20' to the VDD terminal of the log data reader device 30.

The second terminal 13.2 of the test switch interface 13 is used as the fourth connecting element.

Via the fourth connecting element, corresponding to the second terminal 13.2 of the test switch interface 13, the ground terminal GND of the control circuit 11 is connected to the exterior of the emergency converter device 1', in particular via the adapter device 20' to the GND terminal of the log data reader device 30.

The emergency converter device 1' is depicted in FIG. 3 with those elements as considered helpful for understanding the invention. This in particular applies to electric circuit elements and conductor paths (conductor tracks) arranged on at least one printed circuit board of the emergency converter device 1'.

The transistor T1 with resistors R6, R7 and capacitor C1 provides a driver circuit for generating a status indicator light signal to be output via the status indicator light 10, not explicitly depicted in FIG. 3.

The voltage divider consisting of the resistors R8 and R9 is an electric circuit to generate the test switch signal based on a switch status of the test switch 14 (closed or open) that is also not depicted in FIG. 3.

The connecting means according to the second embodiment comprises a conductor path connecting the data transmit terminal USART_TX of the control circuit 11 with the second terminal 9.1 of the test indicator light interface 9 via the resistor R1. The connecting means according to the second embodiment further comprises a further conductor path connecting the data receive terminal USART_RX of the control circuit 11 with the first terminal 13.1 of the test switch interface 13.

The first and second connecting elements of the second embodiment enable therefore a bidirectional data communication with the control circuit 11 from the exterior of the emergency converter device 1'.

Thus, in the second embodiment, the first and second connecting elements are implemented via the second terminal 9.1 of the test indicator light interface 9 and the first terminal 13.1 of the test switch interface 13. The data receive terminal RX of the log data reader 30 is connected via the adapter device 20' to the first connecting element. The data transmit terminal TX of the log data reader 30 is connected via the adapter device 20' to the second connecting element. The log data reader 30 reads data from the non-volatile memory 12, using a data communication performed using the connecting means and the first and second connecting elements.

The process of reading data from the memory 12 is furthermore possible without providing power supply to the control circuit 11 from the power supply interface 2 or the battery interface 7. The log data reader 30 provides electric power from a power output terminal VDD via the adapter device 20' to the third connecting element. The third connecting element in the second embodiment is the first terminal 9.1 of the status indicator light interface 9.

The first terminal 9.1 of the status indicator light interface 9 is connected with a conductor path $V_{DD}$ on the printed circuit board, which provides electric power to control circuit 11. Thus, the second embodiment uses an existing conductor path on the printed circuit board to provide the necessary electric power to the power input terminal VDD of the control circuit 11 from the power output terminal VDD of the log data reader 30.

The process of reading data from the memory 12 uses ground potential provided to the control circuit 11 from the log data reader 30 via the adapter device 20'. The ground terminal GND of the log data reader device 30 is connected via the adapter device 20' to the fourth connecting element. The fourth connecting element in the second embodiment the second terminal 13.2 of the test switch interface 13. The second terminal 13.2 of the test switch interface 13 is in the second embodiment connected with a device ground conductor path on the printed circuit board, which also ensures ground potential at the ground terminal GND of the control circuit 11. Thus, the second embodiment uses an existing conductor path on the printed circuit board to connect the ground terminal GND of the control circuit 11 with the ground terminal GND of the log data reader device 30.

Figure 4:
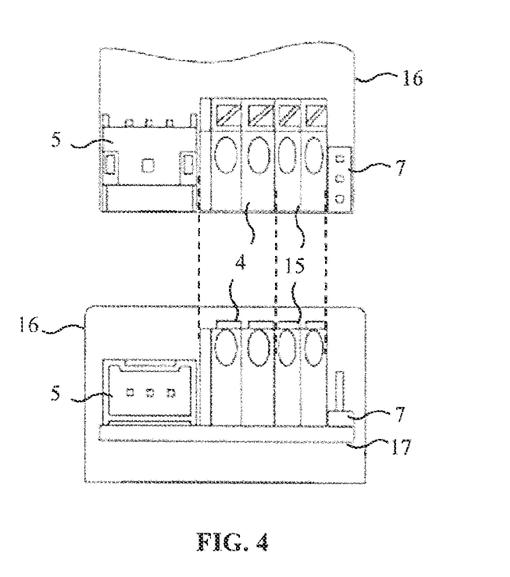

FIG. 4 provides schematic views of the mechanical layout of the interface of an emergency lighting converter according to prior art.

The upper view in FIG. 4 is a partial view of the emergency converter device 1 including the interface of the emergency converter device 1 for connecting an external battery 6, a lighting device 3, a combined test switch and status indicator light, and duration link select switch 7.

The battery interface 5, for example the three-way battery connector shown in FIG. 4, the lighting interface 4 and the duration select interface 7, for example the three pin connector shown in FIG. 4, correspond to the respective elements discussed earlier with reference to FIG. 1.

The combined test switch and status indicator light interface 15 may connect via two-wire connection a combined test switch and status indicator light module, which essentially combines the functions of the status indicator light 10 and the test switch 14 of FIG. 1.

It is apparent that the overall dimensions of the housing assembly 16 of the emergency converter device 1 are critically determined by its interfaces to the exterior. Adding a further connector, for example with four terminals for connecting the log data reader device 30 is apparently difficult for spatial reasons alone and will lead to increasing the overall dimensions of the emergency converter device 1. This may result, on the other hand, in an undesirable loss of compatibility with a current emergency luminaire due to the changed overall dimensions, when intending to add the requirement of reading log data from the emergency converter device 1. This applies in particular to examples of emergency lighting converter devices 1, which do not have any specific communication interface of the control circuit 11 arranged on the printed circuit board 17 of the emergency converter device 1 to the exterior of the housing assembly 16.

Figure 5:
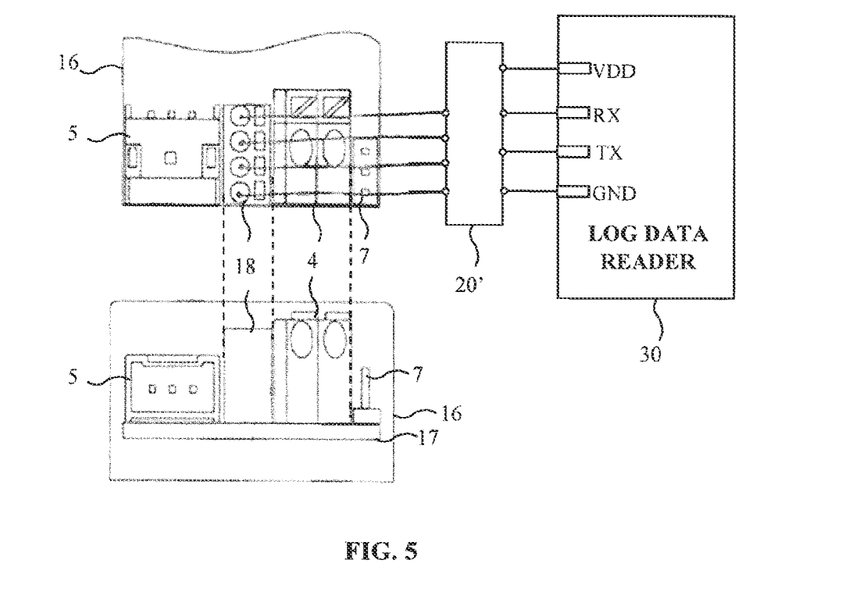

FIG. 5 provides schematic views of the mechanical layout of the mechanical layout of the interface of the emergency lighting converter device 1' according to the second embodiment. The log data reader device 30 reads log data via the adapter device 20' from the internal non-volatile memory 12 of the emergency converter device 1'. The log data reader device 30 reads log data using first, second, third and fourth connecting elements being implemented using the second terminal 9.2 of the status indicator light interface 9, first terminal 13.1 of the test switch interface 13, first terminal 9.1 of the indicator light interface 9 and second terminal 13.2 of the test switch interface 13 respectively for connecting the terminals USART_TX, USART_RX, VDD and GND of the control circuit 11 that is arranged on the printed circuit board 17.

The embodiment shown in FIG. 5 integrates the functions of the status indicator light interface 9 and the test switch interface 13 into a single connector 18. The single connector 18 may for example be a connector of the type Phoenix PTSM 0.5/4-2.5-V THR.

When comparing the emergency lighting converter device 1' depicted in FIG. 5 during the process of reading the log data from the memory 12 with the known emergency lighting converter device as depicted in FIG. 4, the key advantage of the emergency converter device 1' becomes apparent. The capability of using the interface, in particular specific connecting elements of the interface for either connecting the test switch 14 and the status indicator light 8, or using the same connecting elements of the interface for an alternate function of reading log data from a memory 12 of the emergency converter device 1', enables to integrate an additional function into the emergency converter device 1' without increasing the dimensions of the housing assembly 16 of the emergency converter device 1'.

Figure 6:
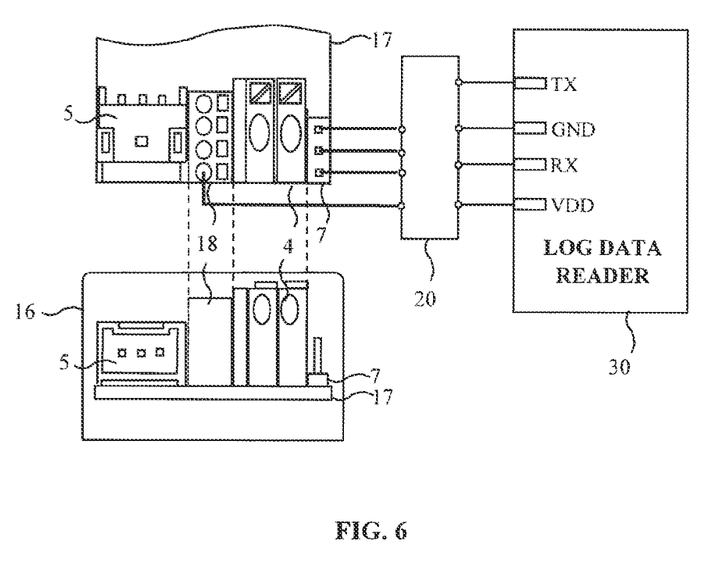

FIG. 6 provides schematic views of the mechanical layout of the mechanical layout of the interface of the emergency lighting converter device 1 according to the first embodiment. The log data reader device 30 reads log data via the adapter device 20' from the internal non-volatile memory 12 of the emergency converter device 1. The log data reader device 30 reads log data using first, second, third and fourth connecting elements being implemented using the first terminal 7.1 of the duration select interface 7, second terminal 7.2 of the duration select interface 7, third terminal 7.3 of the duration select interface 7 and first terminal 13.1 of the test switch interface 13 respectively for connecting the terminals USART_TX, USART_RX, VDD and GND of the control circuit 11 arranged on the at least one printed circuit board 17.

When comparing the emergency converter device 1 depicted in FIG. 6 during the process of reading the log data from the memory 12 with the known emergency converter device as depicted in FIG. 4, the key advantage of the emergency converter device 1 is apparent. The capability of using an existing interface, in particular specific connecting elements of the interface for connecting the test switch 14 and the duration select switch 8, or using the same connecting elements of the interface in an alternate function of reading log data from a memory 12 of the emergency converter device 1, enables to integrate an additional function into the emergency converter device 1 without increasing the dimensions of the housing assembly 16.

The log data reader 30 reads log data using first, second, third and fourth connecting means being implemented using the first terminal 7.1, third terminal 7.3, and second terminal 7.2 of the duration select interface 7, and the second terminal 13.2 of the test switch interface 13, respectively for connecting the terminals USART_TX, USART_RX, GND and VDD of the control circuit 11 arranged on the at least one printed circuit board 17.

The first embodiment of the emergency converter device 1 provides the corresponding advantages as discussed with respect to FIG. 5 and the second embodiment of the emergency converter device 1 due to using the first, second, third and fourth connecting elements of the interface either for the duration select function and the test switch function, or the additional function of reading log data from the memory 12.

With reference to the adapter device 20 or 20', it is to be noted that the log data reader device 30 may be directly connected, for example, using electrical cables with appropriate connectors to the interface, in particular the terminals VDD, TX, RX and GND of the interface of the log data reader device 30 could be connected directly with the third connecting element, first connecting element, second connecting element and fourth connecting element, respectively. In this case, the adapter device 20, 20' essentially corresponds to a suitable electric cable, for example, an electric cable with four wires and suitable connectors for connecting to the interface 31 at one end of the cable and the first to fourth connecting elements on the other end.

Figure 7:
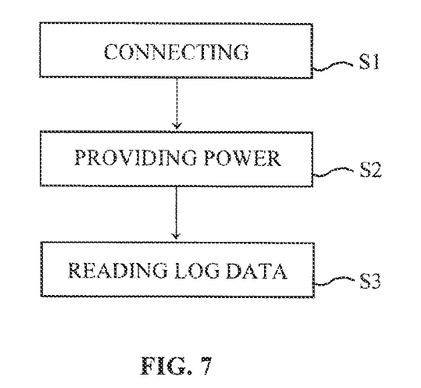

FIG. 7 shows a simplified flowchart with method steps for a data reading method according to an embodiment.

The method comprises a step S1 of connecting an adapter device to the first connecting element and the second connecting element of the interface of the emergency converter device, a third connecting element of the interface to a power supply line of the adapter device and a fourth connecting element of the interface to a ground contact element of the adapter device 20, 20'. The adapter device 20, 20' is further connected with the interface 31 of the data reader device 30 in step S1.

In a subsequent step S2, the data reader device provides electric power to the third connecting element of the interface via the adapter device 20, 20'.

In step S3, then the data is read from the non-volatile memory 12 via the first and second connecting elements of the interface using the data reader device 30 connected to the first and second connecting elements via the adapter device 20, 20'.

The method does accordingly not require opening the housing 16 of the emergency converter device 1, 1' in advance and therefore provides a significant advantage in terms of time and efforts for reading log data from an emergency converter device as presently known.

The invention claimed is:

1. An emergency converter device for providing a supply current to a lighting device (3), the emergency converter device comprising at least one printed circuit board (17) arranged within a housing (16), a control circuit (11) and a non-volatile memory (12) for storing data which are arranged on the at least one printed circuit board (17), an interface configured to mechanically and electrically connect at least one of a status indicator light (10), a test switch (14) and a duration link selector (8), using at least a first connecting element and a second connecting element of the interface, characterized in that the emergency converter device comprises connecting means for connecting a data output terminal (USART_TX) and a data input terminal (USART_RX) of the control circuit (11) to the exterior of the housing (16), wherein the connecting means is configured to connect the first connecting element with the data output terminal (USART_TX) and to connect the second connecting element with the data input terminal (USART_RX) of the control circuit (11).

2. The emergency converter device according to claim 1, characterized in that the interface comprises a status indicator light interface (9) configured to connect the status indicator light (10) and a test switch interface (13) configured to connect the test switch (14).

3. The emergency converter device according to claim 1, characterized in that the interface is configured to connect a first terminal (9.1) of the status indicator light interface (9) as a third connecting element, a second terminal (9.2) of the status indicator light interface (9) as the first connecting element, a first terminal (13.1) of the test switch terminal (13) as the second connecting element and a second terminal (13.2) of the test switch interface (13) as a fourth connecting element.

4. The emergency converter device according to claim 3, characterized in that the third connecting element is connected with a voltage supply terminal (VDD) of the control circuit (11), and the fourth connecting element is connected with a ground contact (GND) of the control circuit (11).

5. The emergency converter device according to claim 3, characterized in that the interface comprises the first, second, third and fourth connecting elements in a single connector (18).

6. The emergency converter device according to claim 1, characterized in that the interface comprises a duration link select interface (7) configured to connect the duration link selector (8) and a test switch interface (13) configured to connect the test switch (14).

7. The emergency converter device according to claim 6, characterized in that the interface is configured to connect a first terminal (7.1) of the duration link select interface (7) as the first connecting element, the second terminal (7.2) of the duration link select interface (7) as a third connecting element to a ground contact (GND) of the control circuit (11), a third terminal of the duration link select interface (7) as the second connecting element, and a first terminal (13.1) of the test switch terminal (13) as a fourth connecting element to a voltage supply terminal (VDD) of the control circuit (11).

8. The emergency converter device according to claim 1, characterized in that the interface comprises the status indicator light interface (9), the duration link select interface (7) and the test switch interface (13) each as a mechanically separate connector mounted on the at least one printed circuit board (17).

9. The emergency lighting system comprising the emergency converter device (1) according to claim 1 and the lighting device (3), characterized in that the lighting device (3) includes at least one lighting diode.

10. A system comprising an emergency converter device (1, 1') according to claim 1, a data reader device (30) and an adapter device (20, 20') for connecting the emergency converter device (1, 1') and the data reader device (30) electrically, characterized in that the adapter device (20, 20') is configured to connect to the first connecting element and the second connecting element of the interface of the emergency converter device (1, 1') and to provide electric power to a third connecting element of the interface and to connect a fourth connecting element of the interface with ground.

11. A method for reading data from an emergency converter device, wherein the emergency converter device (1, 1') comprises at least one printed circuit board (17) arranged within a housing (16), a control circuit (11) and a non-volatile memory (12) for storing data are arranged on the at least one printed circuit board (16), and an interface, wherein the interface connects mechanically and electrically at least one of a status indicator light (10), a test switch (14) or a duration link selector (8) via at least a first connecting element and a second connecting element of the interface, the emergency converter device (1, 1') comprises connecting means for connecting a data output terminal (USART_TX) and a data input terminal (USART_RX) of the control circuit (11) to the exterior of the housing (16), wherein the connecting means is configured to connect the first connecting element with the data output terminal (USART_TX) and to connect the second connecting element with the data input terminal (USART_RX) of the control circuit (11), and the method comprises steps of connecting an adapter device (20, 20') to the first connecting element and the second connecting element of the interface of the emergency converter device (1, 1'), a third connecting element of the interface to a power supply line of the adapter device (20, 20') and a fourth connecting element of the interface to a ground contact element of the adapter device (20, 20'), providing electric power to the third connecting element of the interface via the adapter device (20, 20'), reading the data via the first and second connecting elements of the interface using a reading device (30) connected to the first and second connecting elements via the adapter device (20, 20').

* * * * *